United States Patent
Fujisawa

(10) Patent No.: US 8,853,866 B2
(45) Date of Patent: Oct. 7, 2014

(54) SEMICONDUCTOR DEVICE AND STACKED-TYPE SEMICONDUCTOR DEVICE

(75) Inventor: Yoshitomo Fujisawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 47 days.

(21) Appl. No.: 13/578,109

(22) PCT Filed: Feb. 10, 2011

(86) PCT No.: PCT/JP2011/000742
§ 371 (c)(1),
(2), (4) Date: Aug. 9, 2012

(87) PCT Pub. No.: WO2011/102100
PCT Pub. Date: Aug. 25, 2011

(65) Prior Publication Data
US 2012/0299183 A1 Nov. 29, 2012

(30) Foreign Application Priority Data
Feb. 17, 2010 (JP) ................... 2010-032321

(51) Int. Cl.
| | |
|---|---|
| H01L 23/48 | (2006.01) |
| H01L 21/48 | (2006.01) |
| H01L 25/10 | (2006.01) |
| H01L 23/13 | (2006.01) |
| H01L 23/498 | (2006.01) |
| H01L 23/00 | (2006.01) |
| H05K 1/14 | (2006.01) |
| H01L 23/31 | (2006.01) |
| H01L 25/065 | (2006.01) |

(52) U.S. Cl.
CPC ..... *H01L 25/105* (2013.01); *H01L 2924/15331* (2013.01); *H01L 23/13* (2013.01); *H01L 2225/1058* (2013.01); *H01L 2224/16225* (2013.01); *H01L 23/49822* (2013.01); *H01L 21/481* (2013.01); *H01L 24/48* (2013.01); *H01L 23/562* (2013.01); *H05K 1/144* (2013.01); *H01L 2924/3511* (2013.01); *H01L 23/49816* (2013.01); *H01L 2224/73265* (2013.01); *H01L 2924/15311* (2013.01); *H01L 23/3121* (2013.01); *H01L 2224/48091* (2013.01); *H01L 2224/32225* (2013.01); *H01L 2224/48227* (2013.01); *H01L 25/0657* (2013.01)
USPC .................. 257/786; 257/E23.021; 257/738; 257/676

(58) Field of Classification Search
USPC .......................... 257/738, E23.021, 786, 686
See application file for complete search history.

(56) References Cited

U.S. PATENT DOCUMENTS

| | | |
|---|---|---|
| 6,271,109 B1 | 8/2001 | Weygan |
| 6,750,549 B1 | 6/2004 | Chandran |

(Continued)

FOREIGN PATENT DOCUMENTS

JP 3291368 B2 6/2002

*Primary Examiner* — S. V. Clark
*Assistant Examiner* — Krista Soderholm
(74) *Attorney, Agent, or Firm* — Canon USA Inc IP Division

(57) ABSTRACT

In a semiconductor device according to the present invention, a solder resist has a plurality of openings that expose electrodes. Solder bumps are formed in the openings and each have a solder ball portion protruding from the corresponding opening. The height of the openings is set to increase with increasing gap distance between the electrodes of an interposer substrate and board electrodes of a printed wiring board on which the semiconductor device is mounted. Thus, the solder bumps that correspond to sections where the gap distance is large can be increased in height, whereas the solder bumps that correspond to sections where the gap distance is small can be decreased in height, thereby avoiding the occurrence of defective joints caused by a reduction in size and thickness of the interposer substrate, as well as extending the lifespan of solder joints.

5 Claims, 3 Drawing Sheets

(56) References Cited

U.S. PATENT DOCUMENTS

| | | |
|---|---|---|
| 6,936,922 B1 | 8/2005 | Park |
| 7,863,101 B2 * | 1/2011 | Suzuki et al. ................. 438/109 |
| 2004/0227236 A1 * | 11/2004 | Sawamoto .................... 257/734 |
| 2011/0108982 A1 * | 5/2011 | Kim et al. ..................... 257/737 |

* cited by examiner

SEMICONDUCTOR DEVICE AND STACKED-TYPE SEMICONDUCTOR DEVICE

TECHNICAL FIELD

The present invention relates to semiconductor devices and stacked-type semiconductor devices in which solder bumps serve as external connection terminals.

BACKGROUND ART

In the related art, digital apparatuses, including mobile apparatuses, digital cameras, and digital video cameras, have been reduced in size, and semiconductor devices that allow for higher density packaging have been used for mounting components within a smaller space. As examples of such semiconductor devices, chip scale packages (CSPs) and ball grid array (BGA) packages have been widely used. Regarding CSPs and BGA packages, solder bumps serving as external connection terminals are formed at a lower surface of a package in place of lead terminals so that the mounting area can be reduced. By using such CSPs and BGA packages to reduce the area of a printed wiring board, the demands for size reduction of the aforementioned apparatuses can be met. In order to meet the demands for further size reduction of such apparatuses in recent years, there is a growing need for further reducing the size of CSPs and BGA packages. However, reducing the thickness of a CSP or a BGA package to meet the demands for size reduction of such apparatuses leads to reduced rigidity of the semiconductor device. This tends to increase the amount of warping of the CSP or the BGA package due to heating during a solder joining process in a reflow step.

Warping of the CSP or the BGA package causes a gap to form between terminal electrodes of the semiconductor device and board electrodes of the printed wiring board when the semiconductor device and the printed wiring board are joined to each other, causing defective solder joints to occur. If the connection terminals of the CSP or the BGA package are to be arranged at a narrow pitch, it is necessary to reduce the volume of the solder bumps to prevent the occurrence of bridging between the solder bumps. This results in reduced height of the solder bumps. Furthermore, in order to prevent the occurrence of bridging between the connection terminals arranged at a narrow pitch, it is also necessary to reduce the amount of solder paste, which is to serve as the board electrodes to be printed on the printed wiring board. As a result, the gap formed between the solder bumps and the solder paste printed on the printed wiring board becomes larger due to the warping of the CSP or the BGA package. This leads to a problem in that defective solder joints tend to occur readily.

As a countermeasure against this problem, PTL 1 discusses a method that reduces the occurrence of defective joints by gradually increasing the height of the solder bumps relative to the electrodes toward the periphery of the semiconductor device where the semiconductor device is warped by a great amount. In detail, PTL 1 proposes two methods, namely, a method in which the supply of solder bumps is uniform but the diameter of openings in a resist is reduced toward the periphery of an interposer substrate, and a method in which the supply of solder bumps is gradually increased toward the periphery of the interposer substrate.

However, with the aforementioned method in which the diameter of the openings in the resist is gradually reduced, the reduced diameter results in a reduced joint area between the solder bumps and the electrodes. This results in increased load due to a heating cycle occurring when the power of the semiconductor device is turned on and off. Moreover, even if the diameter of the openings in the resist is reduced, since the solder bumps formed on the electrodes of the interposer substrate are each formed by surface tension into a spherical shape that is larger in size than the diameter of the corresponding opening in the resist, it is difficult to ensure sufficient height for the solder bumps, resulting in a low effect for reducing the occurrence of defective solder joints between the solder bumps and the board electrodes. Specifically, with this method, because the solder joint area is small in sections where the warping amount of the interposer substrate is large, the solder joint strength is reduced, and the lifespan of the solder joints is shortened.

The lifespan of the solder joints of the solder bumps is evaluated on the basis of an accumulation of distortion occurring in the solder bumps due to a mismatch between linear coefficients of expansion of the semiconductor device and the printed wiring board. Therefore, since distortion tends to occur when the contact area of the solder joints is small, it is necessary to ensure sufficient height for the solder bumps by forming the solder bumps with a maximum possible contact area in order to extend the lifespan of the solder joints. Specifically, it is necessary to ensure flatness of the solder bumps by increasing the height of the solder bumps from the electrodes so as to compensate for the warping of the interposer substrate, so that the solder bumps can be reliably soldered to the printed wiring board. However, with the method of the related art in which the supply of solder is gradually increased, the amount of solder is simply increased where the warping amount is large. Therefore, when the terminals are arranged at a narrow pitch, bridging occurs between the solder bumps, which results in a problem of defective joints different from the aforementioned defective joints.

CITATION LIST

Patent Literature

PTL 1: Japanese Patent Publication No. 3291368

SUMMARY OF INVENTION

The present invention provides a semiconductor device that avoids the occurrence of defective solder joints caused by a reduction in size and thickness of an interposer substrate and that allows for a longer lifespan of solder joints.

Solution to Problem

A semiconductor device mounted on a printed wiring board according to the present invention includes an interposer substrate having a plurality of electrodes; a semiconductor element mounted on the interposer substrate; a solder resist provided on the interposer substrate and having a plurality of openings that expose the electrodes; and a plurality of solder bumps that protrude from the openings and connect the electrodes with board electrodes of the printed wiring board. The solder resist that forms the openings has a height that is set to increase with increasing gap distance between the electrodes of the interposer substrate and the board electrodes of the printed wiring board.

Further features of the present invention will become apparent from the following description of exemplary embodiments with reference to the attached drawings.

DESCRIPTION OF EMBODIMENTS

Embodiments of the present invention will be described in detail below with reference to the drawings.

First Embodiment

Figure 1A:
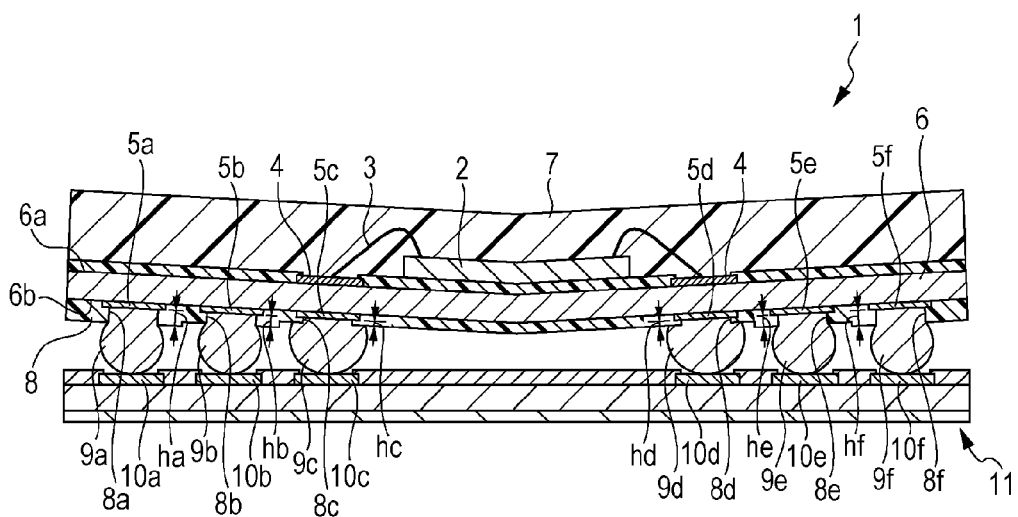
FIGS. 1A-1B are cross-sectional views illustrating a schematic configuration of a semiconductor device according to a first embodiment of the present invention.
Figure 1B:
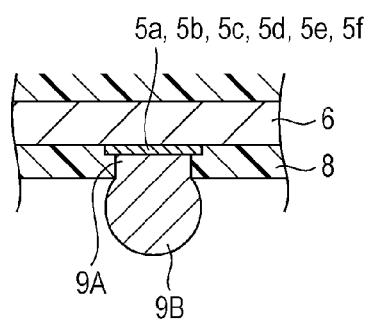

FIGS. 1A and 1B illustrate a schematic configuration of a semiconductor device according to a first embodiment of the present invention. As shown in FIG. 1A, a semiconductor device 1 includes a semiconductor element 2 and an interposer substrate 6 with the semiconductor element 2 mounted thereon, and is mounted on a printed wiring board 11, such as a motherboard, serving as a printed wiring board.

The surface of the interposer substrate 6 on which the semiconductor element 2 is mounted will be defined as a top surface 6a. The top surface 6a is provided with a wire-bonding electrode 4. The semiconductor element 2 and the electrode 4 are connected to each other via a wire 3. The semiconductor element 2, the wire 3, and the electrode 4 are covered with molded resin 7. Although a wire-bonding technique is used for the mounting of the semiconductor element 2 in the first embodiment, a flip-chip technique may be used as an alternative. Furthermore, multiple semiconductor elements may be mounted on the top surface 6a of the interposer substrate 6.

An undersurface 6b of the interposer substrate 6 is provided with a plurality of electrodes 5a, 5b, 5c, 5d, 5e, and 5f. Specifically, on the undersurface 6b of the interposer substrate 6, the electrodes 5b and 5e are respectively disposed at the outer side of the electrodes 5c and 5d, and the electrodes 5a and 5f are respectively disposed at the outer side of the electrodes 5b and 5e. The electrodes 5a to 5f are flat electrode pads and are formed in, but not limited to, for example, a circular shape in plan view.

The semiconductor device 1 includes a solder resist 8 formed at the undersurface 6b of the interposer substrate 6. The solder resist 8 has a plurality of openings 8a, 8b, 8c, 8d, 8e, and 8f that are located at positions corresponding to the electrodes 5a to 5f, respectively, so as to expose the electrodes 5a to 5f. Specifically, in the interposer substrate 6, the openings 8b and 8e are respectively formed at the outer side of the openings 8c and 8d, and the openings 8a and 8f are respectively formed at the outer side of the openings 8b and 8e. The openings 8a to 8f are set to have the same diameter. The openings 8a to 8f are formed in, but not limited to, for example, a circular shape in plan view. The printed wiring board 11 is provided with the same number of board electrodes 10a, 10b, 10c, 10d, 10e, and 10f as the electrodes 5a to 5f at positions corresponding to the electrodes 5a to 5f, respectively. The board electrodes 10a to 10f are flat electrode pads and are formed in, but not limited to, a circular shape in plan view.

The semiconductor device 1 includes a plurality of solder bumps 9a, 9b, 9c, 9d, 9e, and 9f that are respectively provided on the electrodes 5a to 5f. The solder bumps 9a to 9f are set to contain the same amount of solder. This condition in which the solder bumps 9a to 9f contain the same amount of solder includes a case where the amount of solder is within a tolerance range. As shown in FIG. 1B, the solder bumps 9a to 9f each have a columnar portion 9A retained by a sidewall of the corresponding opening 8a to 8f, and a solder ball portion 9B protruding from the corresponding opening 8a to 8f and not retained by the solder resist 8. The columnar portions 9A are connected to the corresponding electrodes 5a to 5f, and the solder ball portions 9B are connected to the corresponding board electrodes 10a to 10f. The solder resist 8 is composed of a solder material with low wettability so that the solder ball portions 9B of the solder bumps 9a to 9f form a protruding spherical shape without spreading over the solder resist 8.

When performing a solder-bump joining process by heating (210 to 240 degrees (Celsius)) in a reflow step, the interposer substrate 6 of the semiconductor device 1 can sometimes warp downward into a convex shape, as shown in FIG. 1A. The warping direction and the warping amount of the interposer substrate 6 are known from a preliminary experiment. In the first embodiment, the interposer substrate 6 is warped such that the gap distance between the electrodes 5a to 5f of the interposer substrate 6 and the board electrodes 10a to 10f of the printed wiring board 11 gradually increases from the center of the interposer substrate 6 toward the periphery thereof.

In light of this, in the first embodiment, the thickness of the solder resist 8 is set such that the height of the openings 8a to 8f from the respective electrodes 5a to 5f increases with increasing gap distance between the electrodes 5a to 5f of the interposer substrate 6 and the board electrodes 10a to 10f of the printed wiring board 11. In detail, since the gap distance between the electrodes 5a to 5f and the board electrodes 10a to 10f increases with increasing distance from the center of the interposer substrate 6 toward the periphery thereof, the thickness of the solder resist 8 is set to increase with increasing distance from the center of the interposer substrate 6 toward the periphery thereof so as to increase the height of the openings 8a to 8f. Specifically, if the heights of the openings 8a, 8b, 8c, 8d, 8e, and 8f are defined as ha, hb, hc, hd, he, and hf, respectively, the thickness of the solder resist 8 is set so as to satisfy the following conditions: hc<hb<ha and hd<he<hf.

In contrast to the height of the openings 8a to 8f being set to increase with increasing gap distance, the diameter of the solder ball portions 9B decreases with increasing height of the openings 8a to 8f. Therefore, in the first embodiment, the height of the openings 8a to 8f is adjusted, and the diameter of the solder ball portions 9B determined by the height of the openings 8a to 8f is adjusted, whereby the ends of the solder ball portions 9B of the solder bumps 9a to 9f are aligned on the same plane.

By gradually increasing the height of the openings 8a to 8f with increasing gap distance so as to ensure sufficient height for the openings 8a to 8f, the solder of each of the solder bumps 9a to 9f is retained by the sidewall of the corresponding opening 8a to 8f and is guided toward the corresponding board electrode 10a to 10f, thereby forming the columnar portion 9A. Consequently, the height of the solder bumps 9a to 9f can be sufficiently ensured. By adjusting the height of the columnar portions 9A, the solder ball portions 9B protruding from the openings 8a to 8f are brought close to the board electrodes 10a to 10f, and the ends of the solder ball portions 9B are aligned on the same plane. Therefore, there is no need to increase the amount of solder for ensuring sufficient height of the solder bumps 9a to 9f. Specifically, in the first embodiment, the solder bumps 9a to 9f are set to contain the same amount of solder. Therefore, bridging between the solder bumps 9a to 9f (for example, between the solder bump 9a and the solder bump 9b) can be avoided.

The solder ball portions 9B of the solder bumps 9a to 9f are brought close to the board electrodes 10a to 10f of the printed wiring board 11 and are aligned on the same plane so as to be connected to the board electrodes 10a to 10f. Therefore, a sufficient solder joint area can be ensured between the solder bumps 9a to 9f and the board electrodes 10a to 10f. In this case, since the openings 8a to 8f are set to have the same diameter, a sufficient joint area can be ensured between the solder bumps 9a to 9f and the electrodes 5a to 5f of the interposer substrate 6. Consequently, defective solder joints in the solder bumps 9a to 9f can be avoided, thereby extending the lifespan of solder joints.

Next, a process of forming the solder resist 8 will be described. Techniques for forming the pattern of the solder resist 8 include a screen-printing technique using a thermo-setting or ultraviolet curable ink material and a photographic technique using a photosensitive resin material. Because it is difficult to increase the positional accuracy of the solder resist 8 using the screen-printing technique, it is preferable to use the photographic technique. When using the photographic technique, the pattern of the solder resist 8 is formed by performing a series of steps including a solder-resist application step, a pre-curing step, an exposure step, a developing step, and a main curing step.

FIGS. 2A to 2G illustrate the steps for forming the solder resist 8 by the photographic technique on the interposer substrate 6 provided with the electrodes 5a to 5f serving as a conductor pattern. The solder resist 8 used in the photographic technique may be formed by using either a photosensitive liquid solder resist or a dry-film solder resist. It is easier to form the solder resist 8 to an accurate height by using a dry-film solder resist having good flatness rather than using a photosensitive liquid solder resist.

Figure 2A:
FIGS. 2A-2G illustrate steps for forming a solder resist.
Figure 2B:
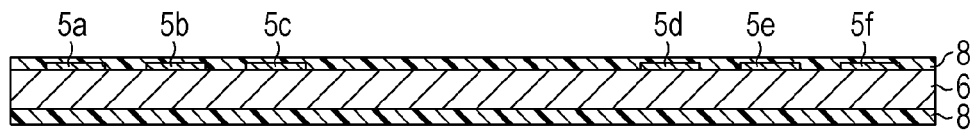

As shown in FIG. 2A, the interposer substrate 6 provided with the electrodes 5a to 5f serving as a conductor pattern is used. As shown in FIG. 2B, in an application step, the solder resist 8 is applied onto the interposer substrate 6. Examples of methods for applying a liquid solder resist onto the interposer substrate 6 include a one-face application method and a double-face application method. The one-face application method can be performed by, for example, spraying or curtain coating, and the double-face application method can be performed by, for example, screening or roll coating. However, the first solder-resist application step is preferably performed by using a method by which the solder resist 8 can be simultaneously applied to both faces so as to prevent the conductor pattern from being contaminated.

Figure 2C:

After the application step, the applied solder resist 8 is cured in a pre-curing step. Then, an exposure step is performed by adhering a mask pattern film over the solder resist 8 and projecting light thereon. Subsequently, a developing step is performed. Consequently, as shown in FIG. 2C, openings are formed at positions corresponding to the electrodes 5a to 5f, thereby exposing the electrodes 5a to 5f. Because the exposed sections do not dissolve in a developing solution, these exposed sections remain after the developing step. The photosensitive solder resist may either be of a negative type in which the exposed sections do not dissolve in the developing solution, as described above, or a positive type in which the exposed sections are removed as a result of dissolving in the developing solution.

Figure 2D:
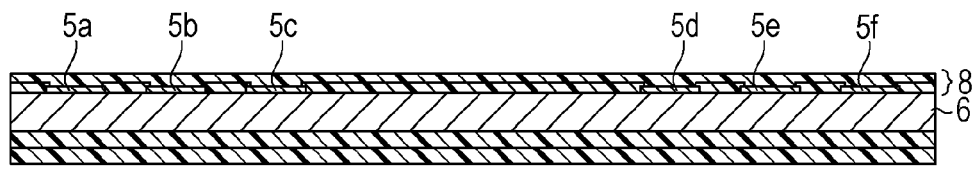
Figure 2E:
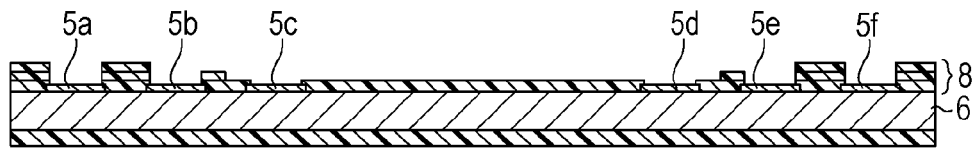

Next, as shown in FIG. 2D, an application step for applying the solder resist 8 to both faces of the interposer substrate 6 is performed. For the second solder-resist application step and onward, either the one-face application method or the double-face application method may be used. Subsequently, an exposure step is performed only on the face to be provided with different heights for the solder resist 8. Then, as shown in FIG. 2E, a developing step is performed. Therefore, the face not to be provided with different heights for the solder resist 8 has the same height as that in FIG. 2C.

Figure 2F:
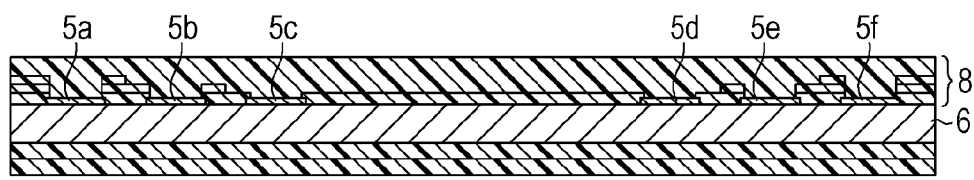
Figure 2G:
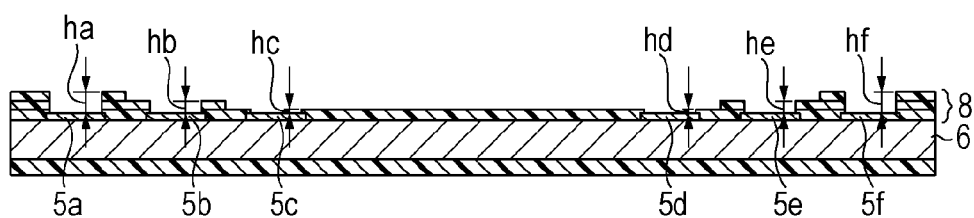

Next, as shown in FIG. 2F, another application step for applying the solder resist 8 is performed. Then, as shown in FIG. 2G, an exposure step is performed by adhering a mask pattern film for only exposing sections of the solder resist 8 to be provided with different heights. Subsequently, a developing step is performed. As a result of these steps, the openings 8a to 8f having different heights ha to hf that gradually increase from the inner periphery toward the outer periphery of the interposer substrate 6 are formed in the solder resist 8. After these steps, the semiconductor element 2 is mounted on the interposer substrate 6 and is sealed with resin, and the solder bumps 9a to 9f with different heights are subsequently formed.

First Practical Example

Referring to FIGS. 1A and 1B, the openings 8c and 8d of the solder resist 8 that respectively correspond to the electrodes 5c and 5d are given a height of 20 micrometers from the electrodes 5c and 5d. The openings 8b and 8e of the solder resist 8 that respectively correspond to the electrodes 5b and 5e are given a height of 40 micrometers from the electrodes 5b and 5e. The openings 8a and 8f of the solder resist 8 that respectively correspond to the electrodes 5a and 5f are given a height of 60 micrometers from the electrodes 5a and 5f. The solder bumps 9a to 9f formed on the respective electrodes 5a to 5f have a diameter of 300 micrometers. In this case, the height from the surface of each electrode 5a to 5f to the end of the corresponding solder bump 9a to 9f is varied as follows. Specifically, the openings 8c and 8d have a height of 20 micrometers and the solder bumps 9c and 9d have a height of 235 micrometers, the openings 8b and 8e have a height of 40 micrometers and the solder bumps 9b and 9e have a height of 240 micrometers, and the openings 8a and 8f have a height of 60 micrometers and the solder bumps 9a and 9f have a height of 245 micrometers. As a result, the differences in the gap between the printed wiring board 11 and the interposer substrate 6 are complemented, and the ends of the solder bumps 9a to 9f are aligned on the same plane, thereby avoiding the occurrence of defective joints during the solder joining process.

When the heights ha, hb, and hc (hf, he, and hd) of the solder resist 8 are varied in a stepwise manner to 40 micrometers, 20 micrometers, and 20 micrometers, respectively, the occurrence of defective joints during the solder joining process can be similarly avoided.

Second Embodiment

Figure 3:
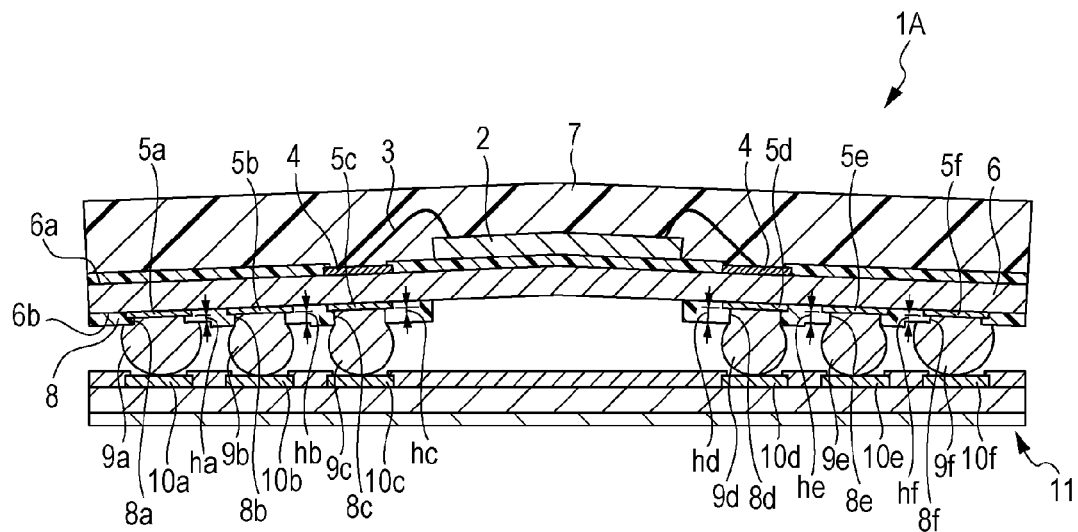
FIG. 3 is a cross-sectional view illustrating a schematic configuration of a semiconductor device according to a second embodiment of the present invention.

Next, a semiconductor device according to a second embodiment of the present invention will be described with reference to FIG. 3. In FIG. 3, components that are the same as those in FIGS. 1A and 1B are given the same reference numerals, and descriptions thereof will be omitted. An interposer substrate 6 of a semiconductor device 1A according to the present invention shown in FIG. 3 differs from that in the first embodiment in that the interposer substrate 6 warps upward into a convex shape during a solder joining process (210 to 240 degrees (Celsius)) of the solder bumps 9a to 9f.

In the semiconductor device 1A, the height of the openings 8a to 8f of the solder resist 8 that respectively correspond to the electrodes 5a to 5f increases with increasing gap distance between the electrodes 5a to 5f and the board electrodes 10a to 10f. In detail, the height of the solder resist 8 is set such that the height of the openings 8a to 8f increases from the periphery of the interposer substrate 6 toward the center thereof. Specifically, if the heights of the openings 8a, 8b, 8c, 8d, 8e, and 8f are defined as ha, hb, hc, hd, he, and hf, respectively, the thickness of the solder resist 8 is set so as satisfy the following conditions: ha<hb<hc and hf<he<hd. Consequently, the height of the openings 8a to 8f is adjusted, and the diameter of the solder ball portions 9B determined by the height of the openings 8a to 8f is adjusted, whereby the ends of the solder ball portions 9B of the solder bumps 9a to 9f are aligned on the same plane.

Even with the interposer substrate 6 that warps upward into a convex shape in this manner, the advantages similar to those in the first embodiment can be achieved. Specifically, by varying the height of the solder resist 8 from the electrodes 5a to 5f in accordance with the warping amount of the semiconductor device 1A, the differences in the gap between the printed wiring board 11 and the interposer substrate 6 are complemented, thereby avoiding the occurrence of defective joints during the solder joining process.

Although the embodiments of the semiconductor device according to the present invention have been described above, the semiconductor device according to the present invention is not limited to the above-described embodiments, and design modifications are permissible so long as they are within the scope that satisfies the configuration of the invention. Although the height of the openings 8a to 8f in the solder resist 8 is gradually varied in the above-described embodiments, the height thereof may alternatively be varied in a stepwise manner.

Although the printed wiring board is described as being a motherboard served by a printed wiring board in the above-described embodiments, the invention is not limited to this example. The invention is applicable to a case where the printed wiring board is served by another interposer substrate, as shown in FIG. 4.

Figure 4:
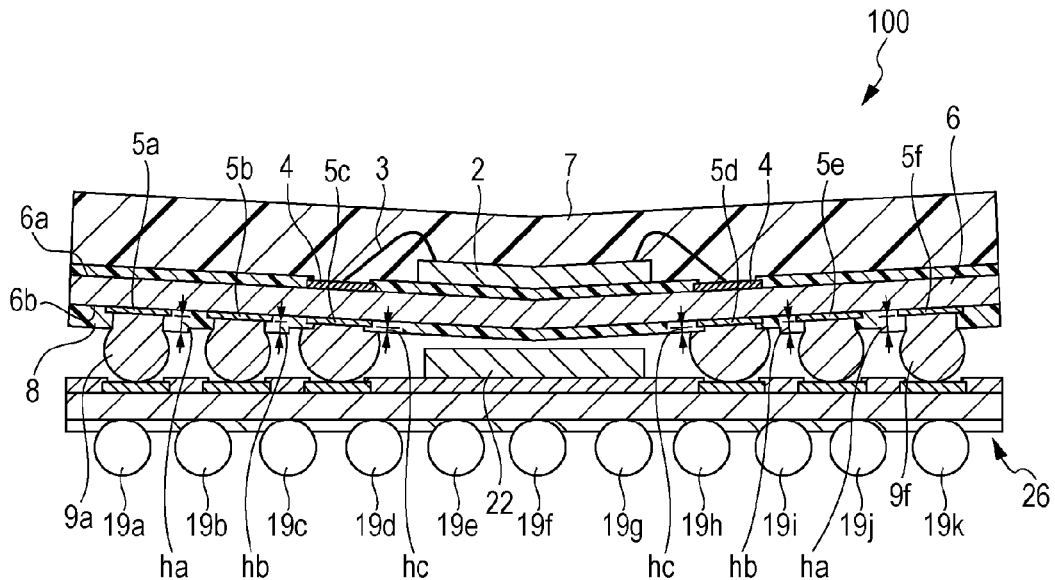
FIG. 4 is a cross-sectional view illustrating a schematic configuration of a stacked-type semiconductor device according to another embodiment of the present invention.

FIG. 4 illustrates a stacked-type semiconductor device 100 in which a first semiconductor device with a first semiconductor element mounted thereon is stacked on a second semiconductor device with a second semiconductor element mounted thereon. In FIG. 4, components that are the same as those in FIGS. 1A and 1B are given the same reference numerals, and descriptions thereof will be omitted. The stacked-type semiconductor device 100 has a configuration in which the semiconductor device 1 according to the first embodiment is electrically connected to an interposer substrate 26 via the solder bumps 9a to 9f. The interposer substrate 26 has a semiconductor element 22 mounted thereon and sends and receives a signal via at least one of the solder bumps 9a to 9f. A surface of the interposer substrate 26 opposite the semiconductor device 1 is provided with a plurality of solder bumps 19a to 19k that are to serve as external electrodes and to be mounted on a motherboard (not shown).

The stacked-type semiconductor device 100 in FIG. 4 is equivalent to a configuration formed by mounting the semiconductor device 1 according to the first embodiment on the interposer substrate 26. However, this embodiment is not limited to such a configuration. For example, the stacked-type semiconductor device 100 may alternatively be equivalent to a configuration formed by mounting the semiconductor device 1A according to the second embodiment on the interposer substrate 26.

Although the above description is directed to a case where the interposer substrate warps upward or downward into a convex shape, the warping shape is not limited thereto. The present invention is applicable to a case where the interposer substrate warps into various complex shapes. For example, with regard to an interposer substrate that warps into the shape of the character W or M, the occurrence of defective joints can be avoided by forming the solder resist with appropriate heights in accordance the aforementioned shape. Regarding such an interposer substrate that bends into the complex shape of the character W or M, the height of solder bumps that are separated from the printed wiring board by a large distance can be increased by adjusting the exposed sections of the interposer substrate in accordance with the bent shape.

According to the present invention, the height of the openings of the solder resist is set to increase with increasing gap distance between the electrodes of the interposer substrate and the board electrodes of the printed wiring board. Therefore, sufficient height is ensured for the openings so that the solder of each of the solder bumps is retained by the corresponding opening and is guided toward the corresponding board electrode, thereby ensuring sufficient height for the solder bump. Since the solder ball portions protruding from the openings can be brought close to the board electrodes of the printed wiring board, there is no need to increase the size of the solder ball portions more than necessary by increasing the amount of solder to ensure sufficient height for the solder bumps. Therefore, bridging between the solder bumps can be avoided. Furthermore, since the solder ball portions are brought close to the board electrodes of the printed wiring board so as to be connected to the board electrodes of the printed wiring board, the solder joint area is increased. Consequently, defective solder joints in the solder bumps can be avoided, thereby extending the lifespan of solder joints.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-032321, filed Feb. 17, 2010, which is hereby incorporated by reference herein in its entirety.

The invention claimed is:

1. A semiconductor device mounted on a printed wiring board, comprising:
   an interposer substrate having a plurality of electrodes;
   a semiconductor element mounted on the interposer substrate;
   a solder resist provided on the interposer substrate and having a plurality of openings that expose the electrodes; and
   a plurality of solder bumps that protrude from the openings and connect the electrodes with board electrodes of the printed wiring board,
   wherein the solder resist that forms the openings has a height that is set to increase with increasing gap distance between the electrodes of the interposer substrate and the board electrodes of the printed wiring board, and
   a height of the solder bump is set to increase with increasing a height of the solder resist,
   wherein a solder resist height for the respective opening is substantially the same on all sides of the respective opening.

2. The semiconductor device according to claim 1, wherein the height of the solder resist that forms the openings gradually increases or decreases from a center of the interposer substrate toward a periphery thereof.

3. The semiconductor device according to claim 1, wherein the solder bumps each include a columnar portion that corresponds to the height of the solder resist and a solder ball portion that is not retained by the solder resist.

4. The semiconductor device according to claim 1, wherein the openings have substantially the same diameter, and each solder bump is formed from substantially the same amount of solder.

5. A stacked-type semiconductor device comprising:
a first interposer substrate having a plurality of electrodes;
a first semiconductor element mounted on the first interposer substrate;
a solder resist provided on the first interposer substrate and having a plurality of openings that expose the electrodes;
a plurality of solder bumps each having a solder ball portion protruding from the corresponding opening;
a second interposer substrate connected to the solder bumps and having a plurality of electrodes;
a second semiconductor element mounted on the second interposer substrate; and
a plurality of external electrodes provided at a surface of the second interposer substrate different from a surface thereof provided with the plurality of electrodes,
wherein the solder resist that forms the openings has a height that is set to increase with increasing gap distance between the electrodes of the first interposer substrate and the electrodes of the second interposer substrate, and
a height of the solder bump is set to increase with increasing a height of the solder resist.

\* \* \* \* \*